United States Patent [19]

Hoffmann et al.

[11] 4,401,749

[45] Aug. 30, 1983

[54] MULTI-LAYER ELEMENTS SUITABLE FOR THE PRODUCTION OF PRINTING PLATES AND RELIEF PLATES, AND THEIR PRODUCTION

[75] Inventors: Gerhard Hoffmann, Otterstadt; Peter Richter, Frankenthal, both of Fed. Rep. of Germany

[73] Assignee: BASF Aktiengesellschaft, Fed. Rep. of Germany

[21] Appl. No.: 348,196

[22] Filed: Feb. 12, 1982

[30] Foreign Application Priority Data

Feb. 28, 1981 [DE] Fed. Rep. of Germany ....... 3107741

[51] Int. Cl.³ .............................................. G03C 1/78
[52] U.S. Cl. .................................... 430/271; 430/533
[58] Field of Search .................... 430/271, 271 A, 533

[56] References Cited

U.S. PATENT DOCUMENTS

| | | | |
|---|---|---|---|
| 3,024,180 | 3/1962 | McGraw | 204/163 |
| 3,036,913 | 5/1962 | Burg | 96/67 |
| 3,674,486 | 7/1972 | Milgrom | 96/35.1 |

FOREIGN PATENT DOCUMENTS

| | | |
|---|---|---|
| 614181 | 2/1961 | Canada . |
| 2321 | 6/1979 | European Pat. Off. . |
| 2138582 | 1/1962 | Fed. Rep. of Germany . |
| 2456439 | 4/1963 | Fed. Rep. of Germany . |
| 2215090 | 5/1965 | Fed. Rep. of Germany . |
| 2444118 | 9/1974 | Fed. Rep. of Germany . |
| 421708 | 1/1979 | Switzerland . |

*Primary Examiner*—Jack P. Brammer
*Attorney, Agent, or Firm*—Keil & Witherspoon

[57] ABSTRACT

A multi-layer element contains a photosensitive layer composed of a mixture of an elastomeric polymer as a binder, a photopolymerizable monomer and a photopolymerization initiator, the photosensitive layer being bonded to a polyester base via an adhesive layer. The adhesive layer is composed of a reaction product, which is insoluble in the process solvents, of a hardenable cellulose ether and a polyisocyanate. The multi-layer element is particularly suitable for the production of printing plates and relief plates, and can be produced by applying a layer of an adhesive, which contains the hardenable cellulose ether and the polyisocyanate, to the polyester base, baking the adhesive to form the insoluble adhesive layer, and applying the photosensitive layer.

9 Claims, No Drawings

MULTI-LAYER ELEMENTS SUITABLE FOR THE PRODUCTION OF PRINTING PLATES AND RELIEF PLATES, AND THEIR PRODUCTION

The present invention relates to multi-layer elements containing a photopolymerizable and/or photocrosslinkable layer which is based on an elastomeric polymer binder and is firmly anchored to a polyester base via an adhesive layer; the multi-layer elements are suitable for the production of printing plates and relief plates having elastomeric relief layers, and possess improved stability in processing and use.

Multi-layer elements for the production of relief printing plates having elastomeric relief layers, as employed for flexographic printing, are known per se and are described, for example, in German Laid-Open Applications DOS Nos. 2,138,582, 2,215,090, 2,456,439, 2,623,801 and 2,942,183, in Canadian Pat. No. 614,181 and in U.S. Pat. Nos. 3,024,180 and 3,674,486. These multi-layer elements in general comprise a photopolymerizable and/or photo-crosslinkable layer of a mixture of an elastomer with a photopolymerizable monomer, this layer being firmly bonded to a dimensionally stable base, for example a plastic film or a sheet of metal. German Laid-Open Application DOS No. 2,444,118 describes a laminate for the production of relief printing plates which are suitable for flexographic printing and in which the relief-forming, photosensitive layer is firmly anchored to a dimensionally stable base, consisting, for example, of a polyester film, which in turn is bonded to a resilient and flexible lower layer. From the publications mentioned, it is also known that it is advantageous to use an intermediate adhesive layer to bond the photosensitive layer firmly to the dimensionally stable base. For such adhesive layers, the use of commercial one-component or two-component adhesives based on polyurethane or polychloroprene, for example, has been proposed. Furthermore, it has been recommended that mixtures of polymeric binders with polymerization initiators be used as the adhesive layer (cf., for example, European Patent Application No. 2-0,002,321 and U.S. Pat. No. 3,036,913). Further, Swiss Patent 421,708 discloses the production of a thin, resilient photopolymerizable element comprising a relief-forming, photopolymerizable layer, a barrier layer and a hardenable adhesive layer on a resilient base, in particular a polyethylene terephthalate film, by a procedure in which a layer of the photopolymerizable composition consisting of monomers and a compatible polymeric binder, as used for the production of the photopolymerizable relief-forming layers, is applied to the polyethylene terephthalate film provided with the hardenable adhesive layer and is partially crosslinked, and a layer of the photopolymerizable composition for the photopolymerizable relief-forming layer is then applied. The hardenable adhesive layer consists of a copolyester and a diisocyanate as the thermal hardener.

However, it has been found in practice that in multi-layer elements comprising a photosensitive layer based on an elastomeric polymer and a polyester film base, the photosensitive layer is, in use, inadequately anchored to the polyester film, even when conventional adhesive layers for these multi-layer elements are used. Thus, when exposed photopolymeric multi-layer elements of this type are washed out and also when photopolymeric printing plates and relief plates produced from these elements are used, the photopolymeric elastomeric relief layer frequently becomes detached from the polyester film used as the base, in particular owing to the effect of the organic solvents used in printing, thereby making the printing plates or relief plates unusable.

It is an object of the present invention to provide photosensitive multi-layer elements which are suitable for the production of relief printing plates for flexographic printing, contain a photosensitive relief-forming layer, based on an elastomeric polymer, firmly anchored to a polyester base, and exhibit improved adhesion between the relief-forming layer and the base during production, processing and use of these multi-layer elements, in the unexposed as well as the exposed state.

We have found that this object is achieved and that multi-layer elements suitable for the production of printing plates and relief plates, and comprising (a) a photosensitive layer of a mixture which is soluble and/or dispersible in aromatic hydrocarbon solvents or aliphatic halohydrocarbon solvents and consists essentially of (a1) one or more elastomeric polymers as the binder, (a2) one or more photopolymerizable, ethylenically unsaturated monomers compatible with the binder, and (a3) one or more photopolymerization initiators activatable by actinic light, with or without (a4) conventional additives, (b) a sheet-like polyester shaped article as a dimensionally stable base for the photosensitive layer (a) and (c) a 2–25 $\mu$m, preferably 3–12 $\mu$m, thick adhesive layer between the photosensitive layer (a) and the dimensionally stable base (b), possess the desired properties when the adhesive layer (c) consists essentially of a reaction product, which is insoluble in the process solvents, of (c1) from 99 to 55% by weight, preferably from 97 to 75% by weight, based on the sum of the components (c1) and (c2), of a cellulose ether which is crosslinkable and hardenable with an isocyanate, and (c2) from 1 to 45% by weight, preferably from 3 to 25% by weight, based on the sum of the components (c1) and (c2), of a polyisocyanate.

For the purposes of the invention, process solvents are those solvents which are employed in the production, processing or use of the multi-layer elements, in the unexposed as well as in the exposed state. These include, in particular, the solvents or solvent mixtures which are used in the production of the photosensitive layer, in the washout and development of the exposed multi-layer elements, and as printing ink solvents when printing with relief printing plates produced from the novel multi-layer elements. As a rule, these process solvents are organic solvents, in particular aromatic hydrocarbon and aliphatic halohydrocarbon solvents as processing solvents and developers, and alcohols, esters and ketones as printing ink solvents.

The excellent bond between the photosensitive layer (a) and base (b) of the novel multi-layer element is all the more surprising since it was not to be expected that the cellulose ethers used in the adhesive layer (c) would be compatible with the materials contained in the photosensitive layer (a). Since an adhesive consisting, for example, of a copolyester and an isocyanate and intended for use, as described, inter alia, in German Laid-Open Application DOS No. 2,215,090 and Swiss Pat. No. 421,708, as an adhesive layer in the production of multi-layer elements containing a photopolymerizable elastomeric layer and a polyester film as the base gives only unsatisfactory results, it was not to be expected that the novel multi-layer elements would exhibit a strong adhesive joint not only before but also after exposure and development of the photosensitive layer, although the treatment of the layers with the developer and the printing ink solvents, and the possible resulting surface swelling of the layer constituents, are known to be capable of reducing the bond strength and to present special problems in the production of firmly bonded laminates. In particular, it could not be foreseen that good adhesion and satisfactory stability to solvents as different as aromatic hydrocarbons on the one hand and alcohols and esters on the other hand would be achieved according to the invention.

Examples of suitable mixtures for the photosensitive layer (a) which is soluble and/or dispersible in an aromatic hydrocarbon solvent or an aliphatic halohydrocarbon solvent and consists of (a1) one or more elastomeric polymers as the binder, (a2) one or more photopolymerizable, ethylenically unsaturated monomers compatible with the binder, and (a3) one or more photopolymerization initiators, with or without (a4) additives which improve the handling and/or processability, are those described in the publications mentioned at the outset, particularly German Laid-Open Applications DOS Nos. 2,138,582, 2,215,090, 2,456,439 and 2,942,183. Elastomeric polymers which are soluble and/or can be swollen in an aromatic hydrocarbon solvent or an aliphatic halohydrocarbon solvent and are thus suitable as the binder (a1) are in particular the corresponding polymers of conjugated aliphatic dienes of 4 or 5 carbon atoms. Examples of these polymers are natural rubber, homopolymers of butadiene and isoprene, copolymers of butadiene and isoprene with one another, and copolymers of butadiene and/or isoprene with other copolymerizable monomers, in particular styrene, acrylonitrile, an alkyl acrylate or methacrylate where alkyl is of 1 to 8 carbon atoms, and others. Examples of such copolymers are nitrile rubbers (eg. butadiene/acrylonitrile copolymers containing from 20 to 35% by weight of acrylonitrile), copolymers of styrene with butadiene and/or isoprene which have a random distribution of the monomers and preferably contain from 10 to 50% by weight of styrene as copolymerized units, and block copolymers of styrene monomers with butadiene and/or isoprene. Particularly advantageous binders (a1) are two-block copolymers of the type A-B and three-block copolymers of the type A-B-A which contain one or two thermoplastic styrene polymer-blocks A, one elastomeric butadiene and/or isoprene polymer block B and in general from 10 to 50% by weight of styrene as polymerized units, and elastomeric three-block copolymers of the type A-B-C which contain a thermoplastic, non-elastomeric styrene polymer block A, an elastomeric butadiene and/or isoprene polymer block B and an elastomeric polymer block C which is different from B and consists of butadiene and/or isoprene, with or without styrene, such copolymers being used as binders according to German Laid-Open Application DOS 2,942,183 for example.

Particularly important photopolymerizable, ethylenically unsaturated monomers (a2) compatible with the elastomeric binder (a1) are the esters of acrylic acid and/or methacrylic acid with monohydric or polyhydric alcohols. These esters include, among others, butyl acrylate, butyl methacrylate, 2-ethylhexyl acrylate, lauryl acrylate, lauryl methacrylate, ethylene glycol dimethacrylate, butane-1,4-diol diacrylate, butane-1,4-diol dimethacrylate, neopentyl glycol dimethacrylate, 3-methylpentanediol diacrylate, 2-hydroxypropyl acrylate, 2-hydroxyethyl acrylate, 2-hydroxyethyl methacrylate, hexane-1,6-diol diacrylate, hexane-1,6-diol dimethacrylate, 1,1,1-trimethylolpropane triacrylate, 1,1,1-trimethylolpropane trimethyacrylate, di-, tri- and tetraethylene glycol diacrylate, tripropylene glycol diacrylate and pentaerythritol tetraacrylate. Vinyl esters of aliphatic monocarboxylic acids, such as vinyl oleate, and vinyl ethers of alcohols, such as octadecyl vinyl ether or butane-1,4-diol divinyl ether, are also suitable.

The photosensitive layer (a) contains in general from 60–95% by weight of the elastomeric binder (a1) and from 5–40% by weight of the photopolymerizable, ethylenically unsaturated monomer (a2).

The photosensitive layer (a) additionally contains an effective amount, in general from 0.01 to 10% by weight and in particular from 0.05 to 5% by weight, based on the components of the photosensitive layer (a), of one or more photopolymerization initiators, eg. benzoin or benzoin derivatives such as the methyl, isopropyl, n-butyl or isobutyl ether; symmetrically or unsymmetrically substituted benzil ketals, eg. benzil dimethyl ketal or benzil methyl ethyl ketal; or acrylphosphine oxides of the type described, for example, in German Laid-Open Application DOS 2,909,992. The photosensitive layer (a) can also contain further additives, such as those conventionally used for improving the handling and processability of multi-layer elements of the type under discussion. These additives include in particular thermal polymerization inhibitors, eg. p-methoxyphenol, hydroquinone or salts of N-nitrosocyclohexylhydroxylamine, dyes, photochromic substances, antioxidants and/or plasticizers. The photosensitive layer (a) contains the additives in conventional amounts, and the total proportion of additives in the photosensitive layer (a) should not in general exceed 30% by weight, and is in particular from 5 to 20% by weight, based in each case on the sum of the components of the photosensitive layer (a).

In the novel multi-layer elements, the dimensionally stable base (b) for the photosensitive layer (a) is a sheet-like polyester shaped article, in particular a polyester film, for example of polyethylene terephthalate or polybutylene terephthalate. The polyester film employed as the dimensionally stable base (b) is in general from 50 to 300 μm thick, depending on the structure of the multi-layer element. To achieve better adhesion, the surface of the polyester film may be pre-treated mechanically or chemically, or, for example, by coating it with a thin layer, preferably from 2 to 25 μm thick, of a conventional one-component or multi-component adhesive, for example an adhesive based on polyurethane or polychloroprene.

According to the invention, the multi-layer element possesses, between the photosensitive layer (a) and the dimensionally stable base (b), a thin adhesive layer (c) for firmly bonding these two layers, the adhesive layer (c) essentially being composed of a product, which is insoluble in the process solvents employed during the production, processing or use of the novel multi-layer elements, and which is obtained by reacting (c1) from 99 to 55% by weight, in particular from 97 to 75% by weight, based on the sum of the components (c1) and (c2), of a cellulose ether which contains free OH groups and which is crosslinkable and hardenable with an isocyanate, and (c2) from 1 to 45% by weight, in particular from 3 to 25% by weight, based on the sum of the components (c1) and (c2), of a polyisocyanate.

Accordingly, an intimate mixture of the cellulose ether, containing free OH groups, and an isocyanate component is advantageously used for producing this adhesive layer.

Conventional commercial ethylcelluloses and hydroxypropylcelluloses which have mean molecular weights of from 30,000 to 500,000 preferably from 50,000 to 300,000, are particularly suitable as the hardenable and crosslinkable cellulose ether, with free OH groups (c1), for the production of the adhesive layer (c). Usually, the hardenable cellulose ether (c1) has a mean degree of etherification of from 2.15 to 2.6. A particularly advantageous ethylcellulose has an ethoxy content of from 45 to 49%, in particular from 47.5 to 49%, and a viscosity (measured at room temperature in a 5% strength by weight solution in a solvent mixture consisting of 80 parts by weight of toluene and 20 parts by weight of ethanol) of from 5 to 50 mPa.s, preferably from 12 to 24 mPa.s. A hydroxypropylcellulose having a mean molecular weight of from 60,000 to 100,000 is similarly advantageous. The hydroxypropylcellulose advantageously contains from 2.5 to 3 free OH groups per polymer unit. To produce the adhesive layer (c) of the novel multilayer element in a simple and advantageous manner, the cellulose ethers (c1) should in general be readily soluble. Particularly suitable solvents are toluene and xylene for the ethylcelluloses and, for example, tetrahydrofuran, methylene chloride, chloroform and 1:1 mixtures of toluene and ethyl acetate for the hydroxypropylcelluloses. The number of free hydroxyl groups in the cellulose ethers (c1), which is important for the hadening and crosslinking with the polyisocyanate, depends on the type of the particular cellulose ether and accordingly can vary within a substantial range. However, this number should be sufficiently great that the reaction with the polyisocyanate gives a product which is no longer soluble in the process solvents. To produce the novel adhesive layers (c), the cellulose ethers can be employed individually or as compatible mixtures.

Isocyanate components suitable for hardening and crosslinking the above hardenable cellulose ethers (c1) in the production of the adhesive layer (c) are the conventional polyisocyanates known from polyurethane chemistry, in particular diurethanes, triurethanes and tetraurethanes, and preferably those having two or more aromatically bonded isocyanate groups. The following may be mentioned as examples: hexamethylene 1,6-diisocyanate, dicyclohexylmethane 4,4'-diisocyanate, isophorone diisocyanate, toluylene 2,4-diisocyanate, toluylene 2,6-diisocyanate, m-phenylene diisocyanate, xylylene diisocyanate, diphenylmethane 4,4'-diisocyanate, naphthylene 1,5-diisocyanate, 3,3'-dimethyldiphenyl 4,4'-diisocyanate, triphenylmethane 4,4',4"-triisocyanate, cyclohexylene 1,4-diisocyanate and tris-(p-isocyanatophenyl)thionophosphate. The hydroxylcontaining cellulose ethers are hardened by using, in general, an amount of isocyanate, within the above range, which provides from 0.8 to 1.6, in particular from 1.0 to 1.2, equivalents of NCO groups of the isocyanate per equivalent of free OH groups of the hardenable cellulose ether.

The hardenable cellulose ether (c1) and the polyisocyanate (c2) are advantageously mixed, for producing the novel adhesive layer (c), by dissolving the components together in a suitable solvent or solvent mixture, for example toluene or mixtures of toluene with other aromatic solvents, eg. xylene, and/or other conventional solvents of a general type. In general, these solutions contain such an amount of solvent that their efflux time in a Ford cup (orifice 4) is about 19 seconds at room temperature. The solution of adhesive-forming components (hereinafter referred to for short as "adhesive solution") is then applied in a conventional manner, for example by brushing, roller-coating, spraying or casting, to the polyester film used as the base (b). After the solvent has been allowed to evaporate off in the air, the applied layer is dried at elevated temperatures, under atmospheric or reduced pressure, and baked to form adhesive layer (c). The thickness of the applied layer is advantageously so chosen that the hardened adhesive layer (c) is from 2 to 25 μm, in particular from 3 to 12 μm, thick after baking. Drying and baking, which hardens the adhesive layer (c), is usually carried out at from 80° to 200° C., in particular from 90° to 150° C., in general in the course of from 0.5 to 20 minutes, in particular in the course of from 0.5 to 5 minutes. The optimum temperature and period of heating for an adhesive layer depend on the components used and should be selected accordingly. The adhesive layer (c) should preferably be hardened and crosslinked until it is insoluble, but may still be surface-swollen, in the process solvents, in particular in aromatic hydrocarbon solvents and/or aliphatic halohydrocarbon solvents, and in alcohols, esters and ketones. The components of adhesive layer (c) are advantageously so chosen that the layer is transparent after the hardening process, ie. drying and baking of the layer, and also remains transparent after treatment with solvents, for example washout of the exposed multi-layer elements. This transparency is advantageous in handling and using the multi-layer elements.

Pigments, pigmenting assistants, and other substances which advantageously affect the processing, for example conventional catalysts for accelerating the polyisocyanate hardening, can also be added to the mixtures of the components in the production of adhesive layer (c). It is often advantageous if the adhesive layer (c) contains antihalation photoactive compounds and/or dyes which absorb light of actinic wavelengths. This is particularly so when the photosensitive layer (a) of the multi-layer element is relatively thin. Layer (c) can contain the dyes in such amounts that up to 40% of the incident light is absorbed. The dyes contained in adhesive layer (c) must not be able to diffuse into the photosensitive layer (a), or to be extracted, for example by residual solvent in the photosensitive layer (a) or by the printing ink solvent. Examples of suitable dyes are those with reactive groups, which are fixed in adhesive layer (c) during the isocyanate hardening of the latter, for example Michler's ketone derivatives having 2 or more hydroxyl groups. Nonmigrating dyes, eg. Zapon Fast Black (C.I. 12,195, Solvent Black 34), Auramin FA (C.I. 41,000, Basic Yellow 2) or Celliton Red GG (C.I. 11,210), are also suitable.

The novel multi-layer elements comprising a photosensitive layer (a) firmly bonded via a special adhesive layer (c) to a polyester film as the base (b) can be produced in a conventional manner. Usually, the adhesive layer (c) is first applied, in the above manner, to the polyester film used as the base (b), and the photosensitive layer (a) is then applied, for example by casting a solution of the components of layer (a) and evaporating off the solvent, to this assembly of hardened adhesive layer (c) and base. (b) Naturally, the photosensitive layer (a) can also first be prepared separately, for example by casting from a solution or by extrusion, and this separate layer can then be laminated or pressed onto the assembly of hardened adhesive layer (c) and base (b). In the latter method, it can be advantageous to provide the hardened adhesive layer (c), before the photosensitive layer (a) is laminated on, with a thin top layer as adhesion-promoting layer (about 5–50 μm, preferably 12–32 μm, thick) which has a composition which is the same as, or similar to, that of the photosensitive layer (a). This thin top layer is most advantageously produced by casting it from a solution of the components.

The novel multi-layer elements are particularly suitable for the production of printing plates and relief plates. These plates can be produced in a conventional manner by imagewise exposure of the photosensitive layer (a) to actinic light, preferably of wavelengths of from 230 to 450 nm, in particular from 300 to 420 nm, and subsequent washout of the unexposed areas with a suitable developer, for example an aromatic hydrocarbon or an aliphatic halohydrocarbon. In general, the photosensitive layer (a) is from 200 to 7,000 μm thick. Since the novel multi-layer elements are used in particular for producing resilient and flexible printing plates, for example those used in flexographic printing, the relief layer (a) should have, in particular, a Shore A hardness (DIN No. 53,505) of from 15 to 70, after exposure and photo-crosslinking. The novel multi-layer elements are also suitable for the production of relief printing plates, for example those described in German Laid-Open Application DOS No. 2,444,118, where the base (b) for the relief-forming, photosensitive layer (a) is in turn additionally bonded to an elastomeric substrate and thus also serves as a stabilizing layer for the laminate. The printing plates and relief plates obtained exhibit excellent adhesion of the relief to the polyester base, even after repeated and prolonged treatment with the process solvents.

In the Examples which follow and illustrate the invention, parts and percentages are by weight, unless stated otherwise. Parts by weight bear the same relation to parts by volume as the kilogram to the liter.

EXAMPLE 1

An adhesive solution was prepared from 5 parts of an ethylcellulose having an ethoxy content of from 45.5 to 46.8% and a viscosity of from 12 to 16 m.Pas, measured at 25° C. in a 5% strength solution of a mixture of 80 parts of toluene and 20 parts of ethanol, 4.3 parts of a 67% strength solution of the reaction product of 3 moles of toluylene diisocyanate with 1 mole of trimethylolpropane, 30 parts of methylene chloride, 40 parts of toluene, 25 parts of butyl acetate and 0.001 part of dibutyl-tin dilaurate. The solution was clear provided that the ethylcellulose had been first dissolved in the methylene chloride.

This solution was applied uniformly to a 75 μm thick polyester film so that a dry adhesive layer about 5–5.5 μm thick resulted after the solvent had been allowed to evaporate off in the air and the adhesive layer had been baked for 5 minutes at 130° C. in a cabinet dryer. Samples of this polyester film provided with the adhesive layer were kept for 24 hours at room temperature in ethanol, ethyl acetate, toluene, tetrachloroethylene or a mixture of 7 parts of ethanol and 3 parts of ethyl acetate. In every case, the adhesive layer was insoluble and could not be peeled off from the polyester film after immersion in the solvent. The adhesive was tack-free, clear and completely transparent both before and after immersion in the solvent.

EXAMPLE 2

An adhesive solution was prepared, as described in Example 1, from 5 parts of an ethylcellulose having an ethoxy content of from 47.5 to 49% and a viscosity of from 18 to 24 m.Pas, measured at 25° C. in a 5% strength solution in a mixture of 80 parts of toluene and 20 parts of ethanol, 4.3 parts of the polyisocyanate of Example 1, 75 parts of toluene, 10 parts of xylene, 15 parts of butyl acetate and 0.001 part of dibutyl-tin dilaurate. This adhesive solution was applied to a polyester film, the solvent was allowed to evaporate off in the air and the layer thus obtained was baked, as described in Example 1. The resulting 5 μm thick, hardened adhesive layer exhibited resistance to solvents, and adhesion, which were as good as those of the samples of Example 1.

EXAMPLE 3

The procedure of Example 2 was followed, except that 3 g of the reaction product of 3 moles of hexamethylene 1,6-diisocyanate and 1 mole of water, as a 75% strength solution in 1:1 ethylglycol acetate/xylene, were employed as the polyisocyanate for the production of the adhesive layer. The laminates comprising the hardened adhesive layer and the polyester film were tested as described in Example 1, and had properties which were as good as those of the laminates of Examples 1 and 2. The good resistance to solvents was particularly noteworthy.

EXAMPLE 4

The procedure of Example 2 was followed, except that the polyisocyanate was replaced by 8.2 g of a 20% strength solution of tris-(p-isocyanotophenyl)thionophosphate in methylene chloride. The laminates comprising the hardened adhesive layer and the polyester film were produced as described in Example 1, and had properties which were as good as those of the samples of Examples 1 to 3.

EXAMPLE 5

The procedure of Example 4 was followed, except that dibutyl-tin dilaurate was not used in the production of the adhesive layer. The results were similar to those of Example 4.

EXAMPLE 6

The procedure of Example 4 was followed, except that the adhesive was baked for only 2 minutes at 115° C., after the solvent had been allowed to evaporate off in the air. The resulting adhesive layer exhibited a resistance to ethanol and tetrachloroethylene similar to that shown by the adhesive layers of Examples 1 to 5; after immersion for 24 hours in ethyl acetate and toluene, slight surface-swelling occurred, thus causing slight tackiness.

EXAMPLE 7

To produce a multi-layer printing plate, a 0.7 mm thick photosensitive layer, produced as described in Example 5 of German Laid-Open Application DOS No. 2,942,183, was applied to a 75 μm thick polyester film adhered to a resilient and flexible substrate, produced as described in Example 3 of German Laid-Open Application DOS No. 2,942,183, the polyester film having been coated with a 5 μm thick layer of the adhesive described in Example 4. The adhesive layer was hardened at 120° C. for 10 minutes. The adhesive contained a mixture of 4,4'-bis-(N-β-hydroxyethyl-N-methylamino)-benzophenone and Auramin FA (BASF, Basic Yellow 2), in the ratio 4:1, for antihalation purposes. The extinction of the 5 μm thick adhesive layer was adjusted to be 0.30 at 360 nm.

In a series of exposure tests, the plate showed a wide exposure range, i.e. isolated fine image sections, such as 150 μm thick lines, were firmly supported on the polyester film and were firmly bonded to the latter. At the same time, the shadow dot wells were of good depth, so that crisp, clean printed copies were obtained.

When such a multi-layer element was exposed through a photographic negative with screen rulings, lines and fine line work for 12 minutes, and then dissolved in a commercial spray washer for 1 minute longer than the required washout time of 4 minutes, using a mixture of 8:2 parts by volume of tetrachloroethylene/n-butanol, the relief image showed no delamination of lines from the base or distortion of lines. The relief image was a faithful reproduction of the original.

COMPARATIVE EXAMPLE

A multi-layer plate was produced as described in Example 7, except that the adhesive layer consisted of 100 parts of a commercial phenoxy resin (PKHH of Union Carbide Corp.), 114.6 parts of tris-(p-isocyanatophenyl)thionophosphate and the same antihalation mixture of 4,4'-bis-(N-β-hydroxyethyl-N-methylamino)-benzophenone and Auramin FA, with the same light absorption of E=0.3 at 360 nm at a thickness of 5 μm.

The adhesive was applied in the form of a solution in tetrahydrofuran, and dried at 120° C. for 10 minutes, to give a 5–7 μm thick layer. The photosensitivie layer was exposed for 12 minutes as described in Example 7, through a photographic negative containing fine lines, screen rulings and line work, and was then washed out for 5 minutes using the same mixture as in Example 7. Particularly at their thinnest ends, the lines and screen rulings exhibited definite signs of delamination which were attributable to inadequate adhesion.

EXAMPLE 8

A multi-layer plate, as described in German Laid-Open Application DOS No. 2,942,183, was produced from (a) a photosensitive relief-forming layer consisting of 85 parts of an ABC block copolymer (block A: polystyrene; block B: polyisoprene; and block C: styrene/butadiene copolymer; A:B:C=1:7.6:1.4), 5 parts of hexane-1,6-diol diacrylate, 5 parts of butane-1,4-diol dimethacrylate, 2 parts of trimethylolpropane triacrylate, 1.0 part of benzil dimethyl ketal, 0.5 part of 2,6-(di-tert.-butyl)-p-cresol, 0.006 part of a black dye (C.I. 26,150, Solvent Black 3) and 5 parts of medicinal liquid paraffin; and (b) a bottom layer consisting of 60 parts of the same block copolymer, 30 parts of liquid paraffin, 10 parts of hexane-1,6-diol dimethacrylate and 0.6 part of benzil dimethyl ketal.

A 75 μm thick polyester film was coated on both sides with a 6 μm thick adhesive layer as described in Example 2. The adhesive layer facing the relief layer was additionally colored with a non-extractable dye (Celliton Red GG, C.I. 11,210) and 4,4'-bis-(N-β-hydroxyethyl-N-methylamino)-benzophenone for antihalation purposes. Before the relief-forming layer was laminated on, a further, 20 μm thick layer consisting of 90 parts of the ABC block copolymer of the relief-forming layer, 10 parts of hexane-1,6-diol dimethacrylate and 1.5 parts of benzil dimethyl ketal was applied to the hardened adhesive layer and pre-exposed for 130 seconds in a flat-plate exposure unit. The relief-forming layer was then laminated onto the tacky surface. The adhesion of the unexposed layer was immediately so great that it could not be peeled off without being torn. After exposure of the whole surface for 20 minutes, washing out for 4 minutes and drying at 80° C. for 1 hour, the peel strengths, measured on 2 cm broad strips, were >3 kp, and the adhesive could not be detached from the polyester film.

After the plates had been immersed in a mixture of 7 parts of ethanol and 3 parts of ethyl acetate for 6 hours, and adhesion had decreased only insignificantly, and delamination did not occur.

EXAMPLE 9

An adhesive was prepared from 5 parts of a hydroxypropylcellulose having a mean molecular weight of 60,000 and a degree of substitution of 3, 34.8 parts of a 20% strength solutin of tris-(p-isocyanatophenyl)thionophosphate, 250 parts of anhydrous tetrahydrofuran and such amounts of 4,4'-bis-(N-β-hydroxyethyl-N-methylamino)benzophenone and Celliton Red GG, in the ratio of 3:1, that when the adhesive had been baked on a polyester film for 5 minutes at 130° C., the resulting 5 μm thick adhesive layer had a total extinction of 0.30 at 360 nm. A 20 μm thick top coating, as described in Example 8, was applied onto the baked, hardened, adhesive layer, the incorporated solvent was allowed to evaporate off in the air, and the layer was dried for 5 minutes at 100° C. Thereafter, the whole surface of the assembly was exposed for 2 minutes in a flat-plate exposure unit. A photosensitive relief-forming layer, as described in Example 8, was then laminated on, using toluene as a laminating aid. The whole surface of this multi-layer plate was then exposed, and the plate was cut into 2 cm broad strips. The adhesion was determined on these strips before and after immersion for 24 hours in ethanol, ethyl acetate, 1,1,1-trichloroethane, toluene or a 4:1 mixture of tetrachloroethane and n-butanol. In each case, the adhesion was greater than the cohesion of the exposed relief layer, so that the peel strength could not be determined.

EXAMPLE 10

A 25 μm thick top layer consisting of 90 parts of an ABC block copolymer, as described in Example 8, 10 parts of trimethylolpropane triacrylate and 2 parts of benzoin methyl ether was applied to the adhesive layer described in Example 5, and the layer was exposed. A photosensitive relief-forming layer, consisting of 90 parts of an acrylonitrile/butadiene rubber containing 28% of acrylonitrile and having a Mooney viscosity of 40, 4 parts of hexane-1,6-diol diacrylate, 4 parts of hexane-1,6-diol dimethacrylate, 3 parts of trimethylolpropane triacrylate, 1.3 parts of benzil dimethyl ketal and 0.005 part of Sudan Deep Black (Solvent Black 3, C.I. 26,150) was applied to the top layer. After the 1.7 mm thick relief-forming layer had been exposed for 30 minutes and washed out in 1,1,1-trichloroethane for 5 minutes, the measured peel strength was 2.8 kp, measured on a 2 cm broad strip. After the exposed plate had been immersed for 24 hours in ethyl acetate, the peel strength was >1 kp, measured on a 2 cm broad strip.

We claim:

1. A multi-layer element suitable for the production of printing plates and relief plates, and comprising
   (a) a photosensitive layer of a mixture which is soluble and/or dispersible in aromatic hydrocarbon solvents or aliphatic halohydrocarbon solvents and consists essentially of
   (a1) at least one elastomeric polymer as the binder,
   (a2) at least one photopolymerizable, ethylenically unsaturated monomer compatible with the binder, and
   (a3) at least one photopolymerization initiator activatable by actinic light, with or without
   (a4) conventional additives
   (b) a sheet-like polyester shaped articles as a dimensionally stable base for the photosensitive layer (a) and
   (c) a 2–25 μm thick adhesive layer between the photosensitive layer (a) and the dimensionally stable base (b), which adhesive layer consists essentially of a reaction product, which is insoluble in the process solvents used during the production, processing or use of the multi-layer element, of
   (c1) from 99 to 55% by weight, based on the sum of the components (c1) and (c2), of a cellulose ether which is crosslinkable and hardenable with an isocyanate, and
   (c2) from 1 to 45% by weight, based on the sum of the components (c1) and (c2), of a polyisocyanate.

2. A multi-layer element as claimed in claim 1, wherein the adhesive layer (c) additionally contains photoactive components and/or dyes.

3. A multi-layer element as claimed in claim 1, containing, as the base (b), a polyester film which may have been pre-treated mechanically, chemically and/or by providing it with an adhesive coating.

4. A multi-layer element as claimed in claim 1, containing, between the adhesive layer (c) and the photosensitive layer (a), an adhesion-promoting layer which is from 5 to 50 μm thick and is insoluble, but can be swollen, in aromatic hydrocarbon solvents or aliphatic halohydrocarbon solvents.

5. A multi-layer element as claimed in claim 1, wherein the hardenable cellulose ether (c1) has a mean molecular weight of from 30,000 to 500,000.

6. A multi-layer element as claimed in claim 5, wherein the hardenable cellulose ether (c1) has a mean degree of etherification of from 2.15 to 2.6.

7. A multi-layer element as claimed in claim 5, wherein the hardenable cellulose ether (c1) is an ethylcellulose having an ethoxy content of from 45 to 49%.

8. A multi-layer element as claimed in claim 5, wherein the hardenable cellulose ether (c1) is a hydroxypropylcellulose having a mean molecular weight of from 50,000 to 300,000 and containing from 2.5 to 3 free OH groups per polymer unit.

9. A multi-layer element as claimed in claim 1, wherein the polyisocyanate (c2) is the reaction product of 1 mole of 1,1,1-trimethylolpropane and 1 mole of toluylene.

* * * * *